United States Patent
Orban

[19]

[11] Patent Number: 5,168,526
[45] Date of Patent: Dec. 1, 1992

[54] DISTORTION-CANCELLATION CIRCUIT FOR AUDIO PEAK LIMITING

[75] Inventor: Robert A. Orban, Belmont, Calif.

[73] Assignee: AKG Acoustics, Inc., San Francisco, Calif.

[21] Appl. No.: 605,538

[22] Filed: Oct. 29, 1990

[51] Int. Cl.⁵ .................... H04B 15/00; H03G 3/00; H03G 7/00

[52] U.S. Cl. .................... 381/94; 381/106; 381/100

[58] Field of Search ............... 381/94, 106, 107, 104, 381/98, 100, 101, 102, 93

[56] References Cited

U.S. PATENT DOCUMENTS

| | | | |
|---|---|---|---|
| 4,208,548 | 6/1980 | Orban | 381/94 |
| 4,249,042 | 2/1981 | Orban | 381/106 |
| 4,363,007 | 12/1982 | Haramoto et al. | 381/94 |
| 4,495,643 | 1/1985 | Orban | 381/106 |
| 4,630,304 | 12/1986 | Borth et al. | 381/94 |
| 4,674,122 | 6/1987 | Orban | 381/106 |

OTHER PUBLICATIONS

McAulay and Malpass Title: A Real-Time Noise Suppression Filter for Speech Enhancement & Robust Channel Vocoding Date: Apr. 1980; Conference, ICASSP 80, Proceedings IEEE Inter. Conf.

*Primary Examiner*—James L. Dwyer
*Assistant Examiner*—Jack Chiang
*Attorney, Agent, or Firm*—Blakely, Sokoloff, Taylor & Zafman

[57] ABSTRACT

Apparatus for reducing distortion in a peak limited audio siganl. The amount of low-frequency spectral energy in the input audio signal is determined for a peak limited signal and used to control low-frequencies in the output audio signal. Identical low-pass filters with cutoff frequencies of 2.2 kHz are used; one passing a peak limited signal, the other a non-peak limited signal. When no noticeable low-frequency spectral energy is present in the peak limited (clipped) signal, the peak level is controlled below 2.2 kHz, without distortion, by a VCA and above 2.2 kHz by a clipper. When low-frequency spectral energy is present, the VCA reduces gain on each low-frequency wave to prevent uncontrolled safety clipping.

12 Claims, 4 Drawing Sheets

FIG_2

FIG_4
HIGH FREQUENCY DOMINATED
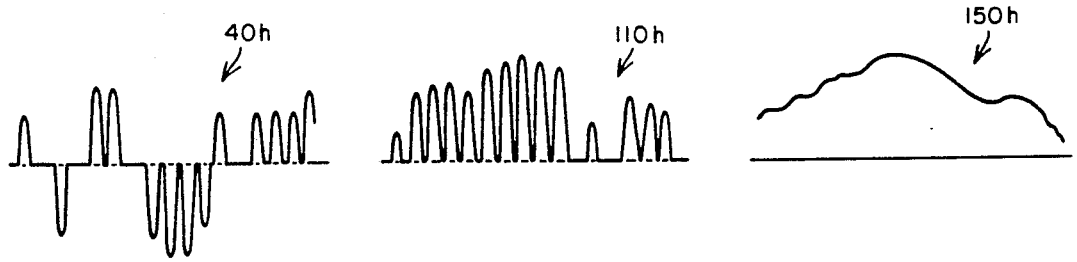
FIG_5
LOW FREQUENCY DOMINATED
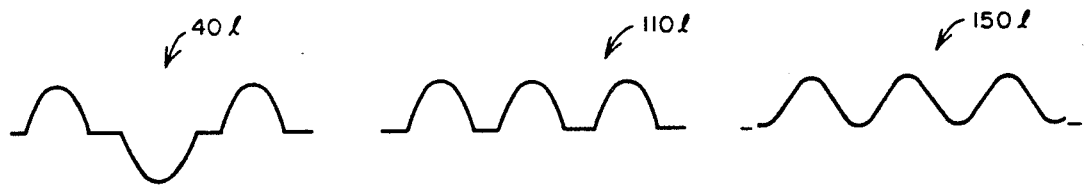

DISTORTION-CANCELLATION CIRCUIT FOR AUDIO PEAK LIMITING

BACKGROUND OF THE INVENTION

1. Field of the Invention

The invention relates to the field of audio peak limiters.

2. Prior Art

The circuit of the present application is an improvement over the distortion-cancellation circuit described in U.S. Pat. No. 4,208,548 (hereinafter the '548 patent). Briefly, this patent describes a method of cancelling clipping-induced distortion containing low-frequency spectral energy by first subtracting the output of the clipper from its input. This differential signal, representing the distortion added by the clipping process, is then applied to a low-pass filter. The output of the low-pass filter is added to the clipped signal, where the clipped signal is delayed by an amount equal to the group delay of the distortion-cancelling low-pass filter.

U.S. Pat. No. 4,495,643 (hereinafter the '643 patent) discusses an improvement of the technique described in the '548 patent that uses Hilbert transforms. The system described in the '643 patent requires the use of relatively expensive circuit elements, including a 90° phase-difference network and a vector sum generator. The '643 patent contains an extensive description of the limitations of the earlier technique set forth in the '548 patent, and provides background that will further the appreciation of the present invention.

As will be seen, the present invention simplifies the circuit of the '643 by eliminating the need for a vector sum generator and for a 90° phase-difference network.

The primary problem with the circuit set forth in the '548 is its handling of low-frequency program material. Bass material processed by the circuit is essentially not peak limited because the clipped waveform is reassembled at its original peak level when the distortion-cancellation signal is summed with the clipped signal. The present invention eliminates this problem by using a circuit conceptually similar to that of the '643 but which is less expensive and which does not require that the audio signal be passed through an allpass filter. (Some experts feel that such filters cause the audio quality to be audibly degraded because different frequencies are delayed by different amounts of time).

SUMMARY OF THE PRESENT INVENTION

An improvement for reducing distortion is described for a peak limited audio signal. The input audio signal is coupled to a band-pass limiting means for limiting the amplitude of a band-passed input audio signal. In the currently preferred embodiment, the band-pass limiting means is realized by a clipper and by first and second low-pass filters with the outputs of the filters being subtracted from one another. In the currently preferred embodiments the first filter has a cut-off frequency of 15 kHz and the second filter has a cut-off frequency of 2.2 kHz.

The input audio signal is filtered through a third low-pass filter to pass the lower-frequencies (e.g., below 2.2 kHz) to a voltage-controlled amplifier. The input audio signal is also used to develop a control signal for this voltage-controlled amplifier. This is done in one embodiment by passing the "clippings" from the clipper audio signal (after rectification) through a fourth low-pass filter. The gain of the amplifier is controlled by the control signal such that the gain decreases as the control signal increases in magnitude. The output of the voltage-controlled amplifier is combined in a combining means with the bandpass limited signal.

When no clipping occurs in the clipper, the gain of the voltage-controlled amplifier is unit and the output of the amplifier cancels the output of the second low-pass filter. Consequently, the output signal is limited in frequency only by the 15 kHz filter.

Assume now that the input audio signal is large enough to cause clipping and there is no noticeable low-frequency spectral energy in the clippings. The output of the fourth low-pass filter is a well-smoothed signal. The amplifier then limits the level of the output of the third low-pass filter without introducing significant distortion because the gain-control signal is smooth. Hence the peak level of the input signal is controlled below 2.2 kHz by the amplifier and above 2.2 kHz by the clipper. The band-pass filter removes clipper introduced distortion below 2.2 kHz.

Finally, assume that there is noticeable low-frequency spectral energy in the clippings. The DC value and low-frequency component of the control signal to the amplifier will reduce the gain of the amplifier on each cycle of the low-frequency wave to control its peak level. This introduces harmonic distortion; however, it assures that the peak level control of the low-frequency signal will be controlled. This prevents uncontrolled clipping in a safety clipper following the system.

BRIEF DESCRIPTION OF THE DRAWINGS

FIG. 4 shows three waveforms for the embodiment of FIG. 1 associated with a high-frequency dominated signal.

FIG. 5 shows three waveforms for the embodiment of FIG. 1 associated with a low-frequency dominated signal.

DETAIL DESCRIPTION OF THE PRESENT INVENTION

An improvement in an audio peak limiting apparatus is described that reduces distortion. In the following description numerous specific details are set forth such as specific frequencies, in order to provide a thorough understanding of the present invention. It will be obvious, however, to one skilled in the art that the present invention may be practiced without these details. In other instances, well-known circuits such as filters have not been described in detail in order not to unnecessarily obscure the present invention.

Certain well-known components of an overall peak-limiting system are not set forth in the present application. For example, a safety peak limiter is typically used at the output of the overall system. Moreover, with the present invention, the level of the low frequency content of the input audio signal (line 10) is limited. (One ways of doing this is described in my U.S. Pat. No. 4,412,100.)

CURRENTLY PREFERRED EMBODIMENT OF FIG. 1

Figure 1:
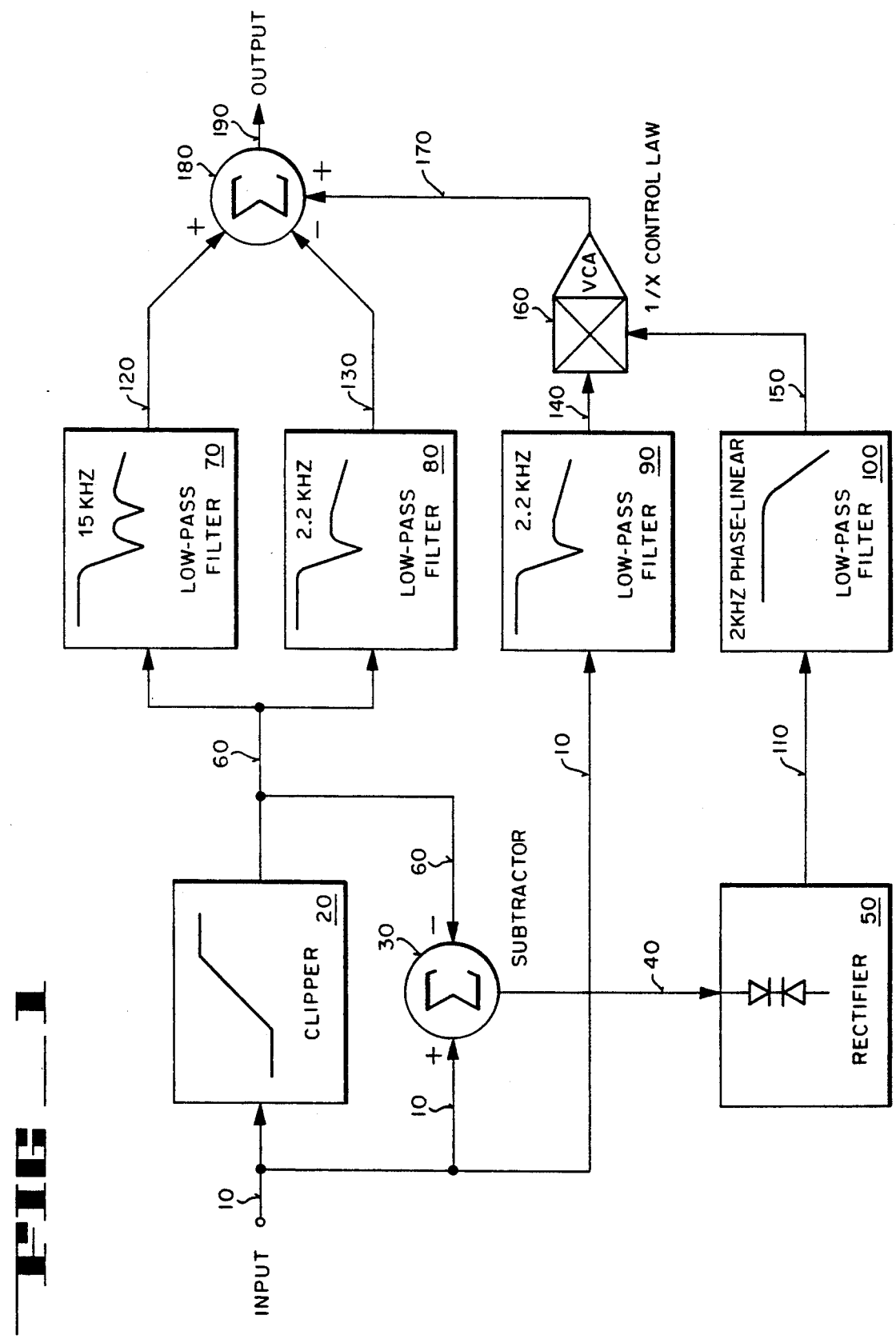
FIG. 1 is a block diagram of the currently preferred embodiment of the present invention.

Referring to FIG. 1, the currently preferred embodiment of the present invention, an input audio signal on line 10 is coupled to a clipper 20. The clipper 20 may be an ordinary clipper, such as a diode clipper, for clipping an audio-frequency signal. The output of the clipper 20, line 60, is coupled to the inputs of a low-pass filter 70 and a low-pass filter 80. The clipper input line 10 is also coupled to a differencing means, specifically to a positive terminal of the subtractor 30. The output of the clipper 20 is coupled to a negative terminal of the subtractor 30. The subtractor 30 provides a waveform representative of the portion of the audio signal which is removed at the output of the clipper, or stated another way, the "clippings". These clippings are coupled over line 40 to a rectifier 50.

The first low-pass filter 70 is a phase-corrected, elliptic-function low-pass filter having a cut-off frequency of 15 kHz. The output of filter 70, line 120, is coupled to a summing means 180. The second low-pass filter 80 is a linear-phase low-pass filter having a cut-off frequency of 2.2 kHz. Filter 80 is syntehsized so that its group delay is essential equal to the group delay of filter 70 in the frequency range of 0 to 2.2 kHz. The output of filter 80 is coupled over line 130 to the summer 180.

In summing means 180, the input on line 130 is subtracted from the signal on line 120. In effect, the filters 70 and 80 and the summing means (ignoring the signal on line 170) is a band-pass filtering means passing signals between 2.2 kHz and 15 kHz. However, as will be seen there is an advantage to using two low-pass filters instead of one band-pass filter.

The other input to the summing means 180 is the low-frequency portion of the input audio signal. The input audio signal is first coupled to a third low-pass filter 90 which is a linear-phase filter hving a cut-off frequency of 2 kHz. (Filter 80 and 90 are identical in the current preferred embodiment.) The output of the filter 90 is coupled to the input terminal (on line 140) of a voltage-controlled amplifier 160. The output of the amplifier 160, line 170, is coupled to the other terminal of the summing means 180.

The control voltage for the amplifier 160 is developed by the rectifier 50 and a fourth low-pass filter 100. The output of the subtractor 30 is rectified by the ordinary rectifier 50. The output of the rectifier 50, via line 110, is coupled to the input of the fourth low-pass filter 100. This phase linear filter has a cut-off frequency of 2 kHz and a group delay essentially equal to the group delay of filters 70, 80 and 90 in the frequency range of 0 to 2.2 kHz. The output of this filter (line 150) controls the gain of amplifier 160. This control is an inverse control, specifically as the output of the low-pass filter 100 increases the gain of amplifier 160 is reduced. Full gain, in the currently preferred embodiment, is unity.

Assumed that the input audio signal is not clipped; that is, its amplitude is below the clipping level of the clipper 20. In this event, no signal is produced by subtractor 30, nor is a signal present at the output of the low-pass filter 100. Consequently, the amplifier 160 is at its maximum gain of unity. Since filters 80 and 90 are identical and the input audio signal is applied to the input of both of these filters, the signals on line 130 and 170 cancel each other. The output on line 190 is the input audio signal with its upper frequencies limited by the low-pass filter 70.

Consider now that substantial clipping occurs and that the clippings do not have noticable low-frequency spectral energy. That is, the clipped portion of the program material is substantially made up of higher frequencies (e.g. above 10 kHz). In this case, the output of the subtractor 30 provides a signal to the rectifier 50 which is rectified. This signal is shown in FIG. 4 as waveform 40h. The output of the rectifier on line 110 consists mainly of a DC component (representing the average value of the signal on line 40) plus high frequency components. This signal is shown in FIG. 4 as waveform 110h. These high frequency components are removed by low-pass filter 100, whose output on line 150, is a well-smoothed signal with a DC component representing, in essence, the average amount of clipping that is occurring in clipper 20. This signal is shown in FIG. 4 as waveform 150h.

This smoothed signal is used to control the gain of VCA 160, which gain is inversely proportional to the signal level on 150. Thus VCA 160 limits the level of the signal on line 140 without introducing significant distortion, because the gain-control voltage is smooth. Thus the peak level of the signal on line 10 is controlled in two frequency bands: below 2.2 kHz it is smoothly controlled by VCA 160 with little distortion, and above 2.2 kHz it is controlled by clipper 20, where the output of clipper 20 (on line 60) has been applied to the band-pass filter created by filters 70 and 80 and subtractor 180. The effect of the band-pass filter is to remove all distortion induced by clipper 20 in the frequency range below 2.2 kHz. The signal on line 190 thus contains little distortion below 2.2 kHz, because it is removed from the signal on line 60 by a band-pass filtering operation, and because the operation of VCA 160 introduces no significant distortion.

Finally, if clipping occurs by clipper 20 and contains substantial low-frequency content, the output of rectifier 50 will contain a mixture of an average DC value added to a substantial low-frequency component. For this case, the signal on line 40 is shown by waveform 40l and the signal on line 110 as waveform 110l, both of FIG. 5. This low-frequency component will pass through filter 100 without attenuation, and will cause VCA 160 to reduce its gain on each cycle of the low-frequency wave to control its peak level. The signal on line 150 is shown in FIG. 5 as waveform 150l. This will, of course, introduce harmonic distortion, but will ensure that the peak level of the low-frequency wave is correctly controlled and therefore will not be clipped in an uncontrolled manner by safety limiting means (not shown) typically used later in an overall peak limiting system.

Thus, the present invention produces no significant difference-frequency intermodulation distortion because of its ability to minimize distortion caused by clipping signals containing mostly high frequencies. Simultaneously, it does clip low frequencies to control the peak level, and well-known means (not shown) prior to the input on line 10 are used to control the level of low frequencies applied to the apparatus of the present invention to prevent excessive clipping distortion.

The embodiment of FIG. 1 is less expensive to realize than the following embodiments and moreover, is less sensitive to manufacturing tolerances because all thresholds automatically track clipper 20.

ALTERNATE EMBBODIMENT OF FIG. 2

Figure 2:
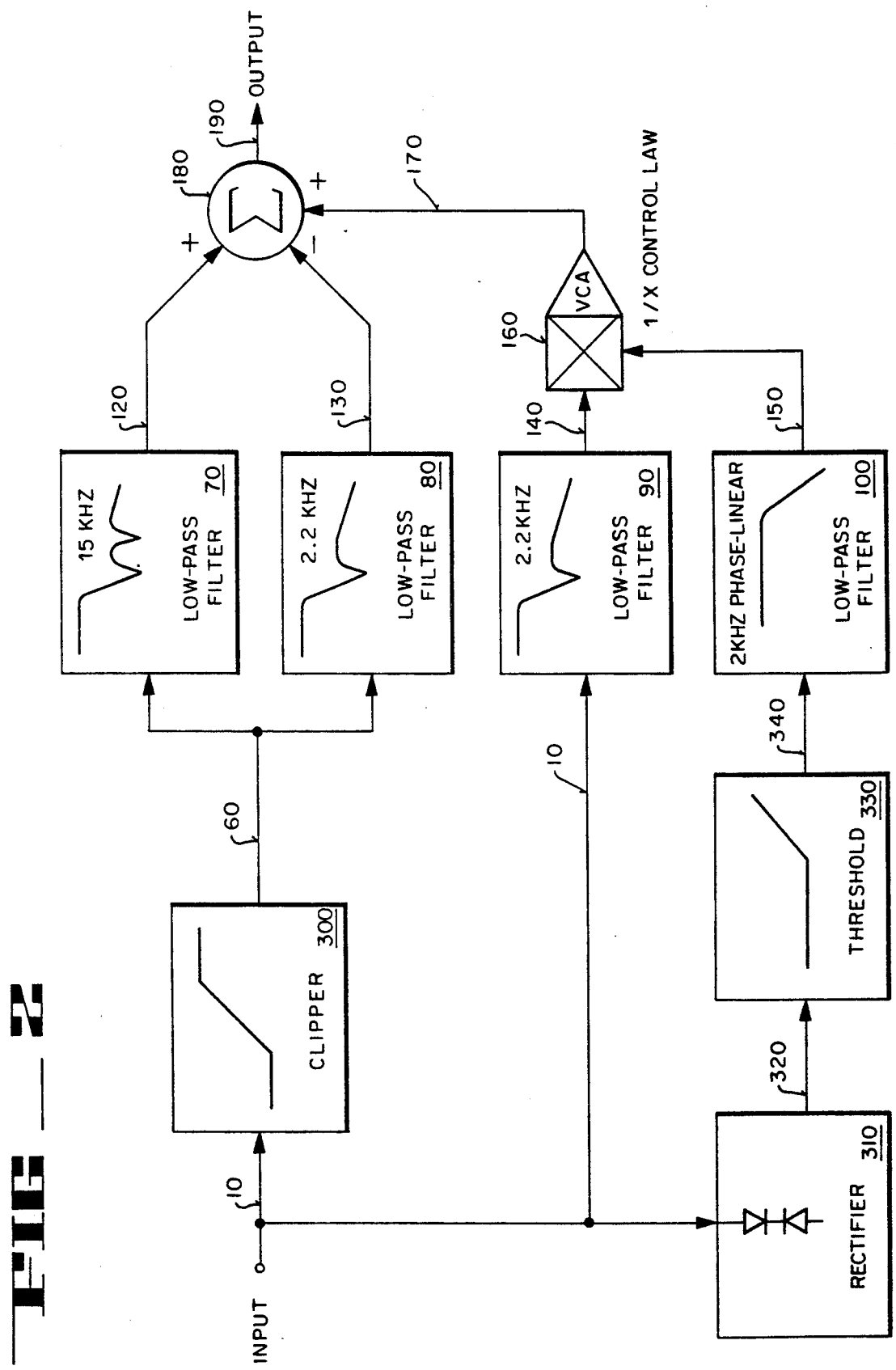
FIG. 2 is a block diagram of an alternate embodiment of the present invention.

In the alternate embodiment of FIG. 2, components which may be identical to the components of FIG. 1 are identified with the same number as used in FIG. 1. Filters 70, 80, 90 and 100, amplifier 160 and summer 180 are again used in FIG. 2. The clipper 300 of FIG. 2 is again an ordinary clipper, although as will be discussed, its threshold level may be different than that of the clipper 20 of FIG. 1. In FIG. 2, clipper 300 receives the input audio signal; the output of the clipper (line 60) is again coupled to the inputs of filters 70 and 80.

A rectifier 310 is used in FIG. 2 to rectify the entire input audio signal. The recitifer's output (line 320) is coupled to a thresholding means 330. Thresholding means 330 provides an output on line 340 to the filter 100 when the input to the thresholding means exceeds a predetermined level. Ordinary thresholding means may be used for this application. Unlike FIG. 1, the control signal for the amplifier 160 is obtained directly from the input audio signal by rectifying the input audio signal and passing it through the thresholding means 330. In effect, the operation of the circuit in FIG. 2 is the same as that of FIG. 1 if the threshold level for thresholding means 330 is adjusted to be identical to the threshold level of the clippre 300. (The embodiment of FIG. 1 is preferred because the threshold of the signal appearing on line 110 always tracks the threshold of clipper 20 since there is only one threshold determining element.)

ALTERNATE EMBODIMENT OF FIG. 3

Figure 3:
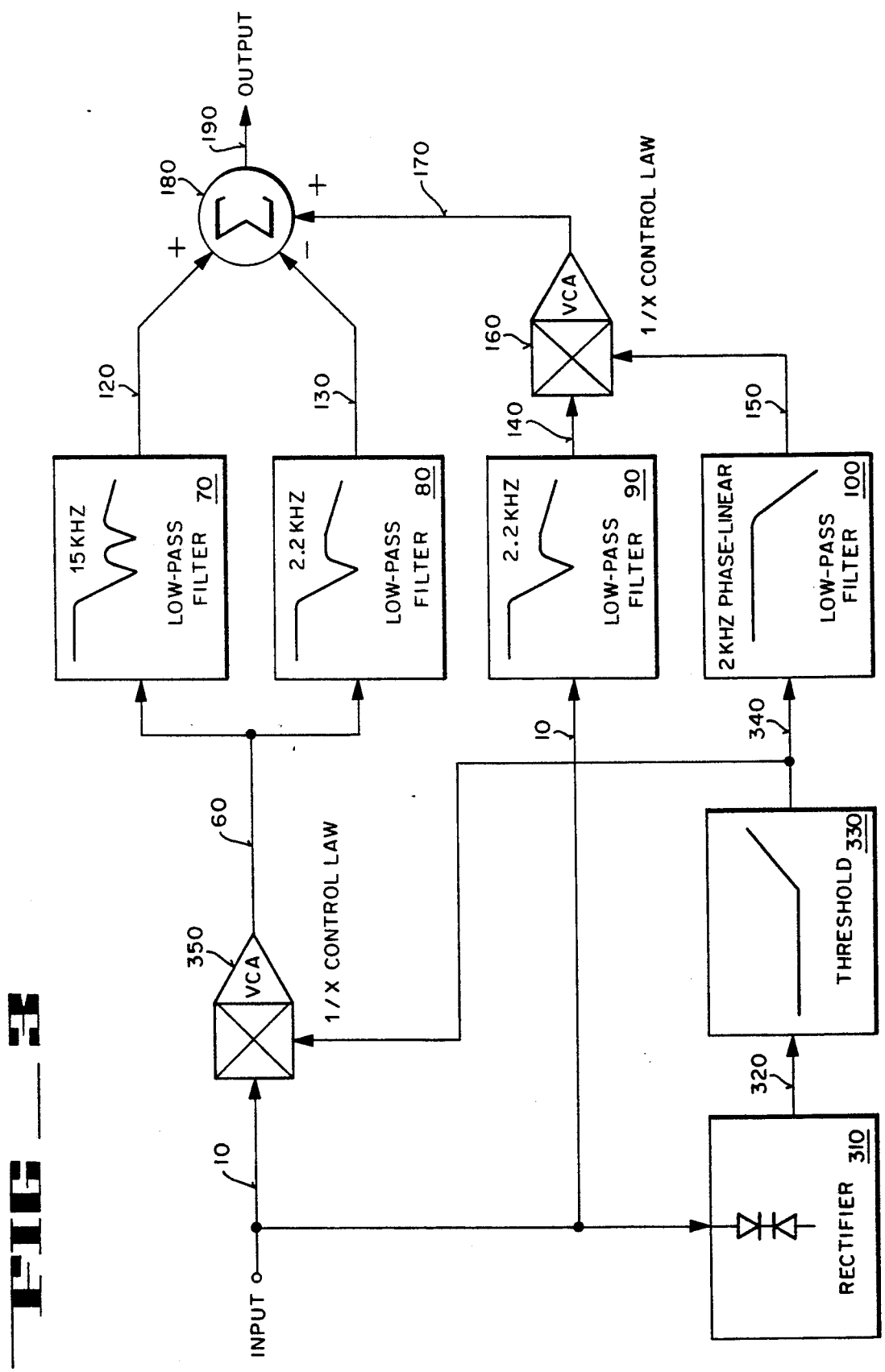
FIG. 3 is a block diagram of another alternate embodiment of the present invention.

In the alternate embodiment of FIG. 3 components which may be identical to components of FIG. 2 are identified by the same number used in FIG. 2. The difference between the embodiment of FIG. 2 and the embodiment of FIG. 3 is that the clipper 200 of FIG. 2 is replaced with a voltage-controlled amplifier 350. The output of the thresholding means 330 (line 340) controls the gain of the amplifier 350. This gain control is an inverse control in that the larger the output signal from thresholding means 330, the lower the gain of the amplifier 350. In the embodiment of FIG. 3, the thresholding means 330 determines the peak level of the output audio signal. If there is no output from the thresholding means 330 then amplifier 350 has unity gain. This is like having no clipping as discussed in connection with the prior embodiments. As the amplitude of the control signal increases, the gain of amplifier 350 decreases, providing peak limiting. Thus, this embodiment operates in a similar fashion to the prior embodiments except that the peak limiting is obtained through a voltage-controlled amplifier 350 rather than through a clipper. Because a voltage-controlled amplifier is more expensive than a clipper, FIG. 1 is preferred to this embodiment.

Thus, a relatively inexpensive and simple apparatus has been described for reducing distortion in a peak limited audio signal.

I claim:

1. In an audio peak limiting apparatus, an improvement for reducing distortion comprising:
    a clipper coupled to receive an input audio signal;
    a differencing means coupled to receive said input audio signal and the output of said clipper, for providing a signal representative of the clippings from said input audio signal;
    a band-pass filter coupled to said output of said clipper;
    a voltage-controlled amplifier for amplifying low-frequencies in said input audio signal;
    control signal generation means coupled to said differencing means for generating a control signal for said amplifier, said control signal representing a direct current level and low-frequency spectral energy in said signal representative of said clippings, said control signal coupled to said amplifier such that less amplification occurs as said low-frequency spectral energy increases;
    combining means for combining the outputs of said band-pass filter and said amplifier to provide an output signal.

2. The improvement defined by claim 1 wherein said control signal generation means includes a rectifier for rectifying said signal representation of said clippings.

3. The improvement defined by claim 2 wherein said band-pass filter comprises a first low-pass filter and a second low-pass filter, said first low-pass filter having a cut-off frequency higher than the cut-off frequency of said second low-pass filter, the difference in cut-off frequencies between said first low-pass filter and second low-pass filter defining a band-pass, and where the output of second low-pass filter is subtracted from the output of said first low-pass filter in said combining means.

4. The improvement defined by claim 3 wherein said input audio signal is coupled to said amplifier through a third low-pass filter, said second and third filters having identical characteristics.

5. The improvement defined by claim 4 wherein said cut-off frequency of said first low-pass filter is approximately 15 kHz, and said cut-off frequency of said second and third low-pass filters is approximately 2.2 kHz.

6. The improvement defined by claim 5 wherein said control signal generation means comprises said rectifier and a fourth low-pass filter.

7. An improvement for reducing distortion in an audio peak limiting apparatus comprising:
    a clipper coupled to receive an input audio signal;
    a first low-pass filter having a cut-off frequency of f1, coupled to receive the output of said clipper;
    a second low-pass filter having a cut-off frequency of f2 coupled to receive said output of said clipper, where f1 is a higher frequency than f2;
    combining means for combining audio signals, the outputs of said first low-pass filter and second low-pass filter being coupled to said combining means such that said output of said second low-pass filter is subtracted from said output of said first low-pass filter;
    a third low-pass filter having a cut-off frequency of approximately f2, the input of said third low-pass filter being coupled to receive said input audio signal;
    a voltage-controlled amplifier coupled to receive the output of said third low-pass filter, the output of said amplifier being coupled to said combining means so as to be combined wtih said output of said first low-pass filter, the output of said combining means providing the output signal of said audio peak limiting apparatus;
    a differencing means coupled to receive said input audio signal and said output of said clipper, for providing a signal representative of the clippings from said audio signal;
    a rectifier coupled to said differencing means for rectifying the output of said differencing means;

a fourth low-pass filter coupled to receive the output of said rectifier;

the output of said fourth low-pass filter being coupled to control the gain of said amplifier such that the gain of said amplifier is reduced as the output of said fourth low-pass filter increases.

8. The improvement defined by claim 1 wherein f1 is equal to approximately 15 kHz and f2 is equal to approximately 2.2 kHz.

9. The improvement defined by claim 8 wherein said fourth low-pass filter is a phase linear filter with a cut-off frequency of approximately 2 kHz.

10. In an audio peak limiting apparatus, an improvement for reducing distortion comprising:

a clipper coupled to receive an input audio signal;

a first low-pass filter having a cut-off frequency equal to f1, coupled to receive the output of said clipper;

a second low-pass filter having a cut-off frequency approximately equal to f2, coupled to receive said output of said clipper where f1 is a higher frequency than f2;

a combining means for combining signals coupled to receive the outputs of said first and second low-pass filters such that said output of said second low-pass filter is subtracted from the output of said first low-pass filter;

a third low-pass filter having a cut-off frequency approximately equal to f2, the input to said third low-pass filter being coupled to receive said input audio signal;

a voltage-controlled amplifier coupled to receive the output of said third low-pass filter, the output of said amplifier being coupled to said combining means such that the output of said amplifier is combined with said output of said first low-pass filter in said combining means, the output of said combining means providing an output signal for said peak limiting apparatus;

a rectifier having only a single input and a single output coupled to receive and rectify said input audio signal;

a thresholding means for providing a signal which exceeds a predetermined threshold, said thresholding means coupled to the output of said rectifier;

a fourth low-pass filter coupled to receive the output of said thresholding means, the output of said fourth low-pass filter being coupled to control the gain of said amplifier such that as the output of said fourth low-pass increases the gain of said amplifier decreases.

11. The improvement defined by claim 10 wherein f1 is equal to approximately 15 kHz and f2 is equal to approximately 2.2 kHz.

12. The improvement defined by claim 11 wherein said fourth low-pass filter is a phase linear filter having a cut-off frequency approximately equal to 2 kHz.

* * * * *